United States Patent
Dicosola et al.

(10) Patent No.: US 7,020,582 B1
(45) Date of Patent: Mar. 28, 2006

(54) METHODS AND APPARATUS FOR LASER MARKING OF INTEGRATED CIRCUIT FAULTS

(75) Inventors: John M. Dicosola, Pleasanton, CA (US); Adam Wright, San Jose, CA (US); Junzhao J. Lei, Santa Clara, CA (US); Mark A. Banke, San Jose, CA (US); William Hata, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 36 days.

(21) Appl. No.: 10/833,384

(22) Filed: Apr. 28, 2004

(51) Int. Cl.
*G06F 11/30* (2006.01)
*G01R 31/28* (2006.01)

(52) U.S. Cl. .................. 702/185; 250/492.22; 714/724

(58) Field of Classification Search .................. 702/35, 702/36, 167, 183, 185; 324/760; 714/724; 707/6; 219/121.68; 372/26; 716/4; 250/49.22
See application file for complete search history.

(56) References Cited

U.S. PATENT DOCUMENTS

| | | |
|---|---|---|
| 5,300,756 A | 4/1994 | Cordingley |
| 5,569,398 A | 10/1996 | Sun et al. |
| 5,808,272 A | 9/1998 | Sun et al. |
| 6,339,604 B1 | 1/2002 | Smart |
| 6,407,363 B1 | 6/2002 | Dunsky et al. |
| 6,723,973 B1* | 4/2004 | Saito ...................... 250/492.22 |
| 2004/0049722 A1* | 3/2004 | Matsushita .................. 714/724 |

OTHER PUBLICATIONS

9820 Laser Semiconductor Processing System brochure (c) 2003 Electro Scientific Industries, Inc.
Karl Suss PA200 Probe Station brochure (2) 2002 Karl Suss.
Signatone CheckMate Probe Station (c) 2001-2002 Signatone Corporation.

* cited by examiner

*Primary Examiner*—Michael Nghiem
*Assistant Examiner*—John H. Le
(74) *Attorney, Agent, or Firm*—G. Victor Treyz

(57) ABSTRACT

Systems and methods are provided for marking integrated circuit defects on wafers to facilitate failure analysis. A wafer containing integrated circuits can be tested using a tester. Test data from the tester can be analyzed using integrated circuit design files to identify suspected faults. A fault location program can be used to identify the physical location of the faults. The fault location program uses information on the faults identified and CAD file information on the physical layout of the integrated circuit to map identified faults to actual physical positions. The fault location program may also generate laser control files. The laser control files can be used to control a laser system so that the laser system creates laser marks on the wafer surrounding each of the faults. The marked faults can be polished and examined under an electron microscope or analyzed using other failure analysis tools.

20 Claims, 6 Drawing Sheets

Slf.EP1S60F13

12.Dat

METHODS AND APPARATUS FOR LASER MARKING OF INTEGRATED CIRCUIT FAULTS

BACKGROUND OF THE INVENTION

This invention relates to integrated circuit failure analysis, and more particularly, to methods and apparatus for marking faults on semiconductor wafers with lasers to facilitate failure analysis.

Faults are often detected when debugging new integrated circuit designs. Typically, electrical testing is performed on a wafer of integrated circuits to identify faults. To investigate the nature of a suspected fault once it has been identified, it is often desirable to cleave and polish a piece of the wafer in the vicinity of the fault. The piece of polished wafer can then be examined under a scanning electron microscope. Analyzing manufacturing faults in this way allows the sources of faults to be eliminated during manufacturing.

The locations of faults on a wafer must be precisely marked before cleaving and polishing. This is generally accomplished using labor-intensive manual marking procedures. With one known approach, a technician consults a computer-aided-design (CAD) view of the integrated circuit design that is displayed on a computer screen by a CAD program. The technician attempts to navigate to the fault by manually counting visually-recognizable features on the screen. Once the fault has been found, the technician places a cursor at the fault location using the CAD program. The technician then obtains the x-y position of the fault from the x-y position information for the cursor that is displayed by the CAD program.

Having manually identified the x-y position of the defect on the wafer, the technician places the wafer in a laser-equipped probe station. The technician then attempts to manually align the wafer in x, y, and θ to achieve vertical, horizontal, and angular alignment. After aligning the wafer in the vicinity of the defect, the technician can manually step the probe station stage by appropriate horizontal and vertical offset distances to reach marking locations that surround the fault. It is generally necessary to manually realign the wafer in the vicinity of each fault selected for marking.

Conventional marking arrangements such as these are labor intensive and prone to error. It may take hours to mark a single wafer, particularly when the defects are hard to locate in the CAD file or when many manual alignments are required at the probe station. Moreover, the process is dependent on the skills of the technician, which makes it difficult to control the accuracy of the process.

SUMMARY OF THE INVENTION

In accordance with the present invention, systems and methods are provided for marking integrated circuit faults for failure analysis. The systems and methods of the invention increase marking accuracy and throughput.

Wafers can be electrically tested for faults using a tester. Test data obtained from the tester can be analyzed to identify faults. Information on suspected faults can be provided to a fault location identification and laser control program. This program can use computer-aided design (CAD) files and information on the identified faults to produce physical position information for each fault and laser control files. The laser control files can be used to direct a computer-controlled laser system to make laser marks surrounding each of the faults.

Further features of the invention, its nature and various advantages will be more apparent from the accompanying drawings and the following detailed description of the preferred embodiments.

BRIEF DESCRIPTION OF THE DRAWINGS

FIGS. 6 and 7 show illustrative laser marking system control files that may be generated by the fault location identification and laser control program in accordance with the present invention.

DETAILED DESCRIPTION OF THE PREFERRED EMBODIMENTS

The present invention relates to systems and methods for marking faults on wafers of integrated circuits for failure analysis. After an integrated circuit has been designed, it is customary to fabricate a batch of test wafers. Each wafer typically contains numerous integrated circuits. In a production run, the wafers are diced into individual integrated circuit die and are packaged as individual circuits. However, during preliminary testing, the integrated circuits are not generally packaged. Rather, integrated circuits are subjected to electrical testing while they are still part of a test wafer.

The electrical testing process may reveal one or more faults (defects) on a wafer. For example, on a wafer of 13 integrated circuits, it may be determined that integrated circuit number five has an electrical fault in the second row and third column of a particular block of memory cells. With the present invention, physical position information may be automatically created for faults that have been identified within the circuitry of an integrated circuit. For example, the fault located in the second row and third column of the block of memory cells may be mapped to a physical location of 2456.490 microns in the horizontal (x) dimension and 2847.480 microns in the vertical (y) dimension. The systems and methods of the present invention can also be used to automatically mark defects once their physical locations have been determined.

Figure 1:
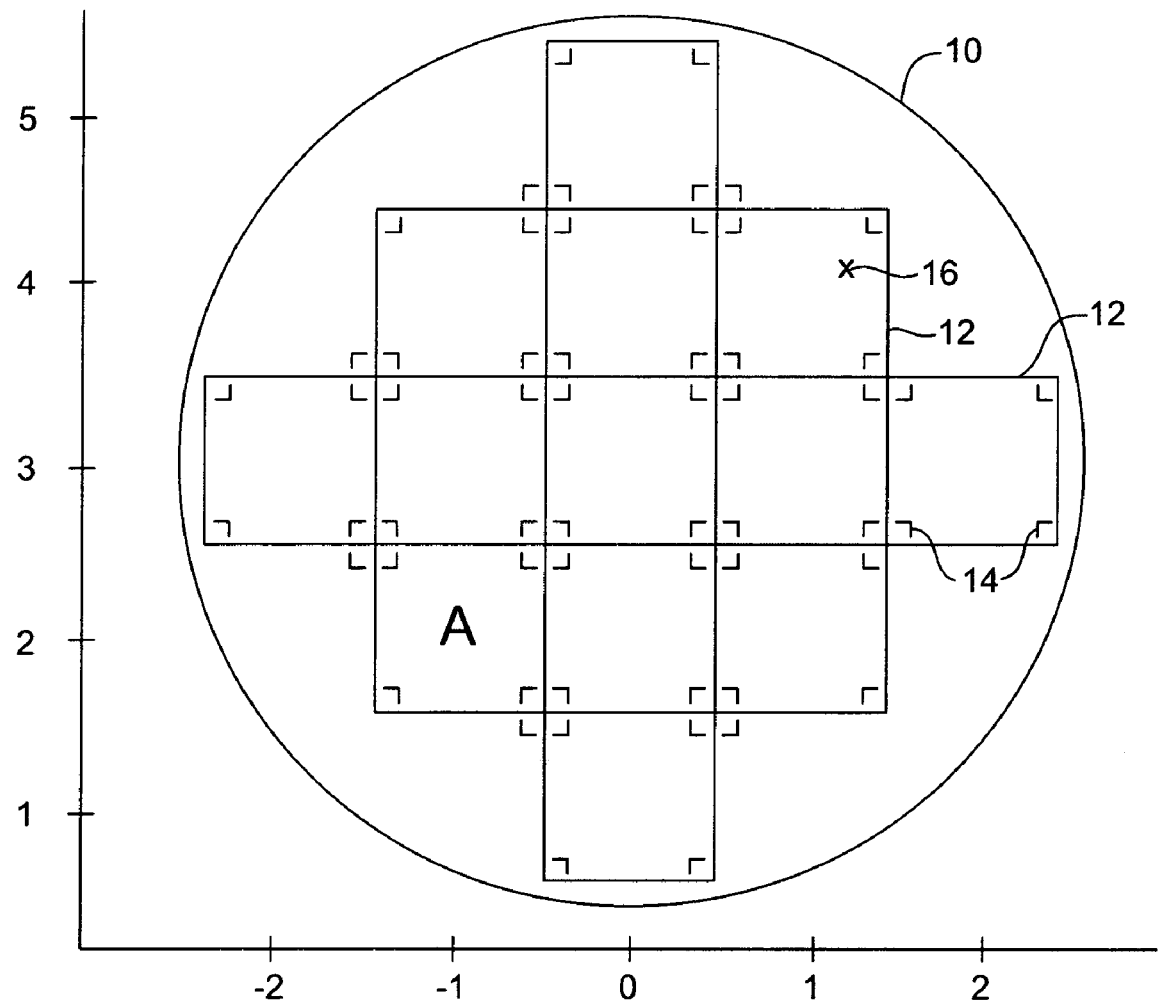
FIG. 1 is a view of the top surface of an illustrative wafer of integrated circuits that contains a fault for laser marking in accordance with the present invention.

A typical test wafer 10 is shown in FIG. 1. Wafer 10 has a number of integrated circuits 12. In a typical modern semiconductor manufacturing process, wafers 10 are silicon wafers and may, if desired, include a buried insulating layer (e.g., a buried oxide layer in a silicon-on-insulator wafer). Other types of wafers may be used if desired (e.g., non-semiconductor wafers or wafers of other semiconductor materials such as GaAs, InP, etc.). For clarity, the present invention will be described in the context of silicon wafers.

Each wafers 10 is processed using a semiconductor manufacturing process that creates electrical devices (e.g., metal-oxide-semiconductor transistors) and interconnects on its surface. Electrical devices such as transistors are formed partly from the silicon substrate of the wafer. Conductive lines and dielectric layers are used to form a complex pattern of interconnects on top of the electrical devices.

Faults may be unintentionally formed within the integrated circuits of a wafer during the semiconductor manufacturing process. For example, if an interconnect line was made too thin, testing may reveal an unexpected open circuit or an overly-resistive connection between devices. As another example, an oxide layer might not be insulating properly because it is too thin or is not aligned properly with the components on the circuit. This could lead to a short circuit or a transistor failure.

Because certain flaws are only revealed upon fabrication and testing of the integrated circuit, it is expected that new integrated circuit designs will go through a debugging process. With this approach, a relatively small quantity of test wafers can be fabricated, before committing to production volumes. The test wafers can be tested without dicing the wafers into individual integrated circuits and packaging them into standard integrated circuit packages. Testing the wafers at this stage avoids the complications associated with packaging the wafers and facilitates failure analysis using diagnostic tools such as surface profiling tools, optical microscopes, electron microscopes, etc.

During the fabrication process, each integrated circuit is generally provided with alignment marks 14, as shown in FIG. 1. These alignment marks can be used to align wafers 10 and circuits 12 during testing and laser marking.

An illustrative fault 16 within one of the integrated circuits is shown in FIG. 1. There may be any number of faults 16 in a given test wafer, but a single fault 16 is shown in FIG. 1 to avoid over-complicating the drawing. Because subsequent failure analysis may reveal that a device that was suspected to be defective may, in fact, be performing satisfactorily, faults such as fault 16 are sometimes referred to as "suspected faults" in the following discussion.

Various coordinate systems may be used to identify each integrated circuit 12 on wafer 10. In the illustrative coordinate system of FIG. 1, the wafer 12 that is marked with the "A" is located at die location −1, 2. This die identification scheme is merely illustrative. Integrated circuits 12 may be identified on wafer 10 using any suitable arrangement.

Figure 2:
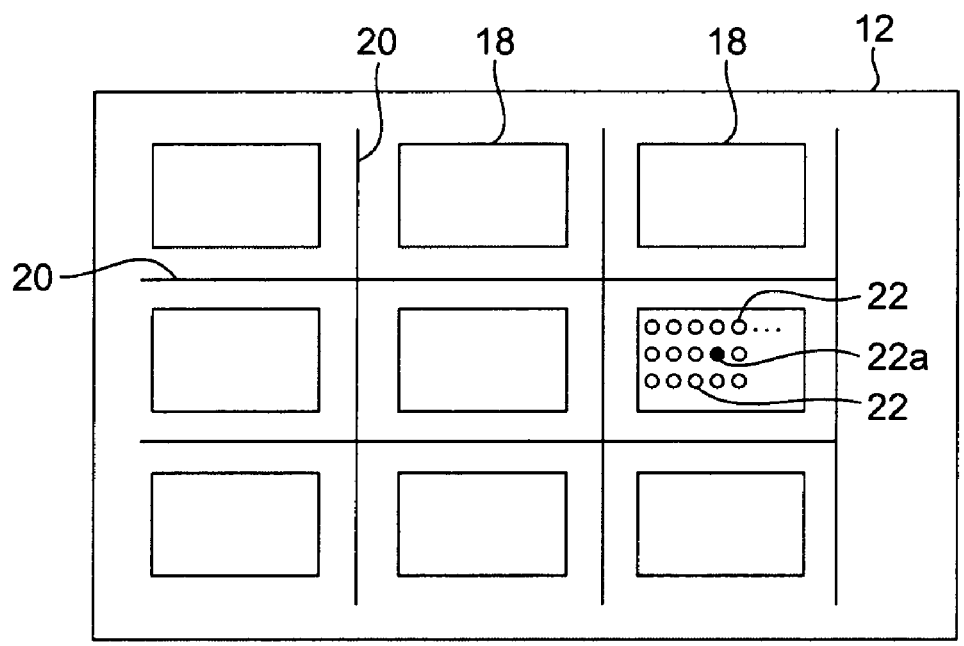
FIG. 2 is a diagram of an illustrative integrated circuit that contains a fault for laser marking in accordance with the present invention.

The circuitry on a typical integrated circuit is generally formed using a somewhat regular pattern of electrical devices and interconnects. This is shown schematically in FIG. 2. In the example of FIG. 2, integrated circuit 12 has blocks of logic 18 arranged in rows and columns. Some of the interconnect structure on integrated circuit 12 is shown by the vertical and horizontal interconnect conductors 20 in FIG. 2. Circuit 12 may be, for example, a digital signal processor, an application specific integrated circuit, a microprocessor, a memory chip, a programmable logic device, etc.

As shown in FIG. 2, the larger regions of logic 18 may contain smaller circuit elements 22, one or more of which may be defective, as shown by defective element 22a. In general, any circuit component might be defective (e.g., a transistor, an interconnect line, etc.). In the example of FIG. 2, circuit 12 may be a programmable logic device, blocks 18 may be blocks of hardwired and/or programmable logic, and elements 22 may be configuration random-access-memory (RAM) bits whose values (when programmed) are used to customize the programmable logic on the programmable logic device to perform a desired custom logic function.

Using electrical testing, the particular element that is thought to be defective (i.e., faulty element 22a of FIG. 2) is identified. Using the systems and methods of the present invention, this fault identification information is translated into actual physical position information in x-y coordinates. Based on this position information, the fault can be marked. For example, the dielectric stack and/or encapsulation layers on the upper surface of the wafer can be marked by exposing them to pulses of laser light. Laser spots are typically small (on the order of microns in diameter), so laser marking can be highly precise. Any suitable wavelength of laser light may be used (e.g., 1.34 microns). With one suitable arrangement, laser light sources that are commercially available in integrated circuit processing and testing tools may be used.

Figure 3:
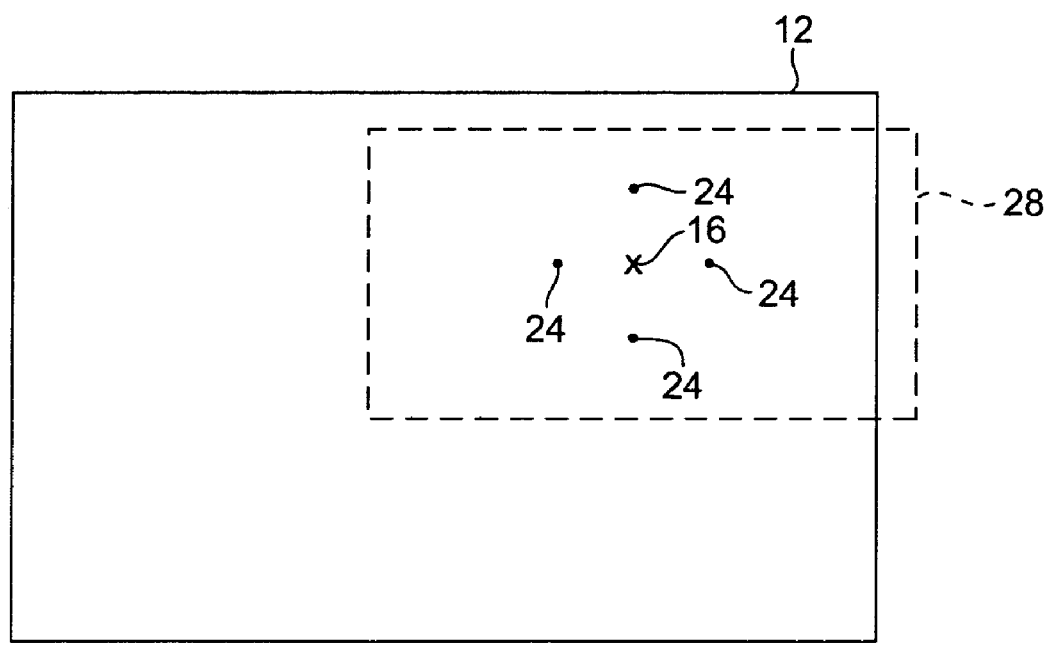
FIG. 3 is a diagram showing how the fault of the integrated circuit of FIG. 2 may be marked using a laser marking system in accordance with the present invention.

The diagram of FIG. 3 shows the integrated circuit 12 of FIG. 2 without the circuit details of FIG. 2. As shown in FIG. 3, the fault 16 corresponding to the defective RAM bit 22a of FIG. 2 may be marked with a diamond-shaped set of surrounding laser marks 24. There may be, for example, four marks (dots) 24. Two of the marks may be vertically aligned with fault 16 and may be spaced at equal distances (for example) to the right and left of fault 16 along the horizontal axis. The other two marks 24 may be horizontally aligned with fault 16 and may be spaced at equal distances above and below the fault. If desired, more than four marks may be used, although excessive marking should be avoided to prevent undue complexity.

Faults may be marked using any desired marking scheme or pattern. An advantage of the scheme shown in FIG. 3 is that after a sample has been removed from the wafer along dotted lines 28, either pair of opposing marks (e.g., the two horizontally-aligned marks or the two vertically-aligned marks) can serve as guides indicating where polishing should stop (as an example). This allows accurate cross-sections to be made and facilitates the failure analysis process.

As shown in the example of FIGS. 2 and 3, the circuit 12 may have a complex structure made up of numerous electrical elements. Even if an electrical tester and test data analysis program identifies a particular element (e.g., RAM bit 22a in row 2 and column 4 of the array of configuration RAM bits in the logic block 18 in the second row and third column of circuit 12) as containing a suspected fault, it may be difficult to locate and mark that fault using conventional techniques. With such conventional techniques, it would be necessary to display a computer-aided-design (CAD) file for the integrated circuit on a computer monitor and to manually count blocks 18 and/or the rows and columns of elements 22 to attempt to identify the defective bit (bit 22a in this example). Moreover, with conventional approaches, after placing the CAD program's cursor on the defective bit to obtain a manual readout of the x-y position of the defect, the wafer would need to be manually aligned and manually marked in a laser-equipped probe station.

With the present invention, a fault location identification and laser control program can analyze test data and produce corresponding laser control data. The laser control data can then be used to drive a laser system. If desired, the laser system can automatically align each test wafer. Following alignment, the laser system can mark the faults on the wafer in accordance with the laser control data from the laser control program.

Figure 4:
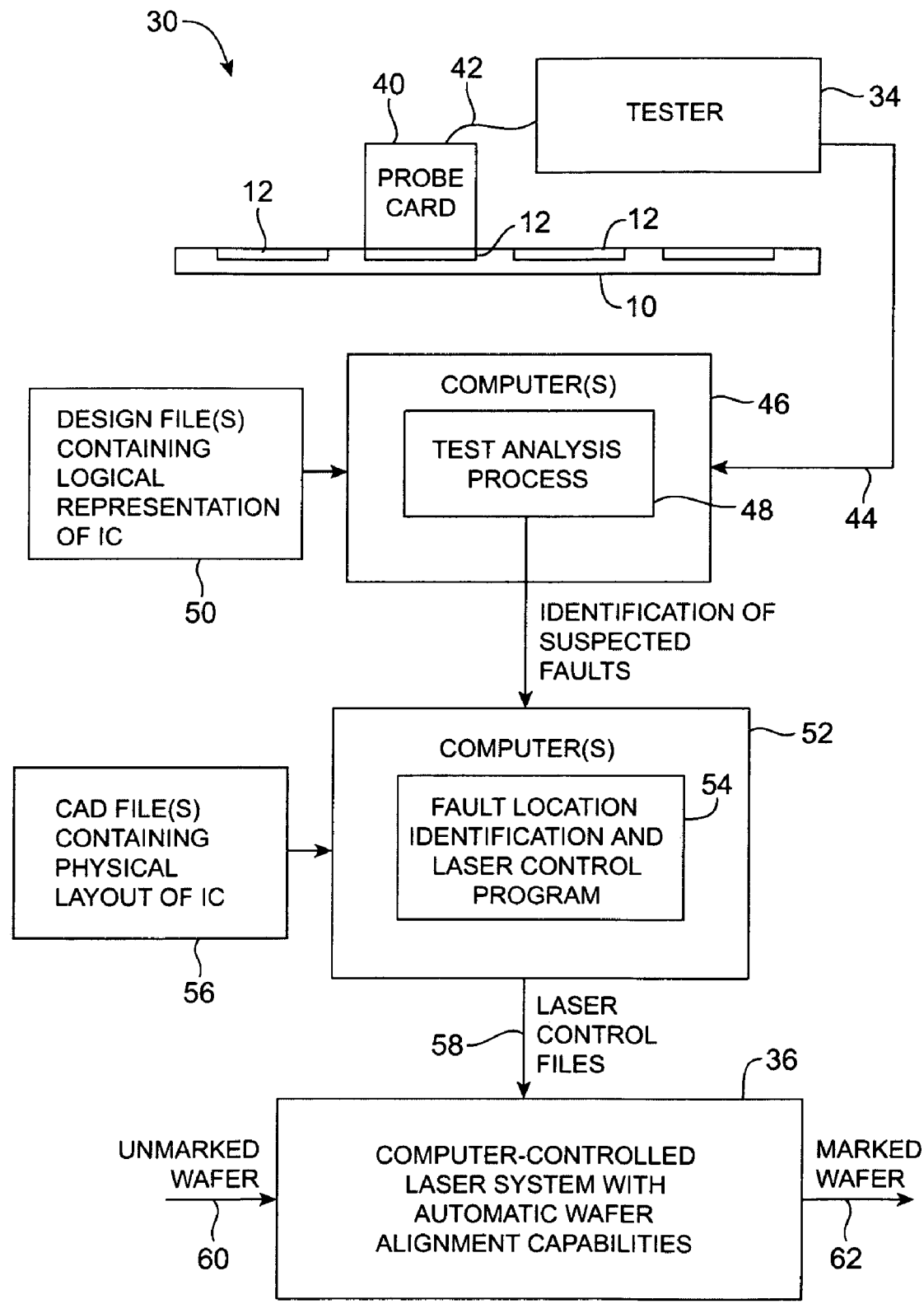
FIG. 4 is a diagram of an illustrative laser marking system in accordance with the present invention.

An illustrative system 30 in accordance with the present invention is shown in FIG. 4. In system 30, a test wafer 10 is initially tested using a tester 34, as shown in FIG. 4. Later, the test wafer may be loaded into the computer-controlled laser system 36 and, following laser marking, unloaded for polishing and examination under an electron microscope or other suitable failure analysis operations. The loading of an unmarked wafer prior to marking is shown schematically by line 60 in FIG. 4. Line 62 illustrates how the wafer is unloaded from laser system 36 after marking.

The present invention preferably marks faults using lasers. If desired, other marking schemes may be used. For example, marks can be made to wafer 10 using a pointed probe structure or other mechanical structure mounted on computer-controlled stages, a dye or pigment-based marking system, electrical marking techniques, etc. For clarity, the present invention will be described in the context of laser marking arrangements. With such arrangement, a short burst of laser light may be applied to the surface of wafer 12 to create a visually discernable mark on the surface materials (e.g., by locally heating and/or ablating polyimide layers or other dielectric layers, etc.)

Wafer 10 typically contains numerous integrated circuits 12. (The circuitry of each circuit 12 is referred to herein as an "integrated circuit," even though it has not yet been packaged as an integrated circuit ready for sale to a customer.) The circuits 12 may be tested using a tester 34. Tester 34 is electrically coupled to each circuit 12 that is being tested by a probe card 40 and associated cabling 42. Testers such as tester 34 are available commercially.

Tester 34 may test each integrated circuit 12 on the wafer 10, before presenting instructions to the user of system 30 to unload the wafer 10. If desired, tester 34 and/or laser system 36 can be configured to handle cassettes of wafers 10, rather than a single wafer, which helps increase throughput. For clarity, the present invention will be described primarily in the context of testing and marking a single wafer 10.

During testing, tester 34 may apply test vectors to each integrated circuit 12 in an attempt to locate faults (i.e., potential and/or actual faults). As an example, the tester might load and unload certain patterns of bits from configuration RAM on a programmable logic device to determine whether the RAM bits are operating correctly. Tests may be performed at different frequencies, to determine whether the integrated circuit can operate within its specified frequency range. Some tests may involve applying static test signals to part of the circuit while applying dynamic test signals to another part of the circuit. These examples are merely illustrative. Any suitable test techniques may be used if desired.

As tester 34 tests the circuitry of circuits 12, test data is produced. The test data from tester 34 may be provided to one or more computers 46, as shown schematically by line 44. Computer(s) 46 may be, for example, one or more computers that are networked together in a corporate local-area network (LAN). One or more test analysis programs (referred to herein as a test analysis process 48) may be used to determine whether any of integrated circuits 12 contain faults. The test analysis process uses as inputs both the test data from tester 34 and information on the designs of the integrated circuits 12. The information on the designs of the integrated circuits 12 may be provided, for example, using a logical representation of the integrated circuits 12 in one or more design files 50. Files 50 may, as an example, contain hardware description language code that defines the logical functionality of integrated circuit 12. The code may be in a hardware description language such as Verilog.

The test analysis process knows how the integrated circuit should function by virtue of the logical representation of the integrated circuit 12 that has been supplied in logic design files 50 and knows how the integrated circuit actually performed by virtue of the test results gathered by tester 34. By comparing actual performance to predicted performance, test analysis process 48 can identify faults in the integrated circuit. The test analysis process 48 passes information on the identified faults to fault location identification and laser control program 54. Program 54 (which may be implemented using one or more software programs or processes) may run on one or more computers 52. Computer(s) 52 may be the same as computer(s) 46, may overlap with computer(s) 46 or may be different than computer(s) 46.

Fault location identification and laser control program 54 is provided with information on the physical layout of the integrated circuit 12. This information may be provided, for example, in the form of one or more CAD files 56 containing the physical layout of the integrated circuit. The CAD files 56 contain information that specifies the physical x-y location of each circuit component within the integrated circuit 12. Because the components that are faulty are specified by the information received from the test analysis process 48, fault location identification and laser control program 54 has sufficient information to produce relative physical location data (i.e., relative x-y coordinates) for each of the faults within each integrated circuit.

If, for example, test analysis process 46 identifies a given fault as being associated with a particular RAM bit, the position of that RAM bit within its integrated circuit 12 can be determined by using the CAD file representation of the RAM bit. The CAD files contain the actual position information that was used to create the mask sets employed in the semiconductor fabrication process that formed integrated circuit 12. The CAD files therefore contain information specifying where that particular RAM bit resides in the integrated circuit 12.

The absolute position of the fault on the wafer requires both relative x-y position information and absolute x-y position information. The CAD files 56 can be used to generate relative x-y position information for each fault (i.e., information that specifies the physical location of each fault relative to an origin or other fixed reference point of the integrated circuit containing that fault). To generate the absolute position of the fault, information may also be supplied to fault location identification and laser control program 54 that specifies which particular integrated circuit die is associated with each fault.

A suitable coordinate system for identifying die locations is shown in FIG. 1. This scheme, or any other suitable scheme may be used to uniquely identify each integrated circuit and its associated faults. For example, if tester 34 finds a fault in the bottommost integrated circuit in FIG. 1, tester 34 can label the fault with wafer coordinates (0, 1), to indicate which integrated circuit 12 on wafer 10 contains the fault. Similarly, if tester 34 locates a fault in the uppermost integrated circuit 12 on wafer 10 of FIG. 1, the tester 34 can label that fault with wafer coordinates (0, 5).

The wafer coordinate data that indicates the location of each integrated circuit 12 for each fault within wafer 10 may be provided to fault location identification and laser control program 54. For example, test analysis process 48 may include wafer coordinates in the information that is provided to program 54 that identifies the suspected faults. As a result, the fault location identification and laser control program 54 can keep track of which integrated circuit location is involved with each fault.

After fault location identification and laser control program 54 has determined the physical position of each fault, the user (i.e., the technician or other system operator using system 30) may be provided with an opportunity to select which faults are to be marked. The user may, for example, be provided with a series of computer screens containing on-screen options that the user can click on to make selections. Drop-down menus and other suitable user interfaces may be used.

Figure 5:
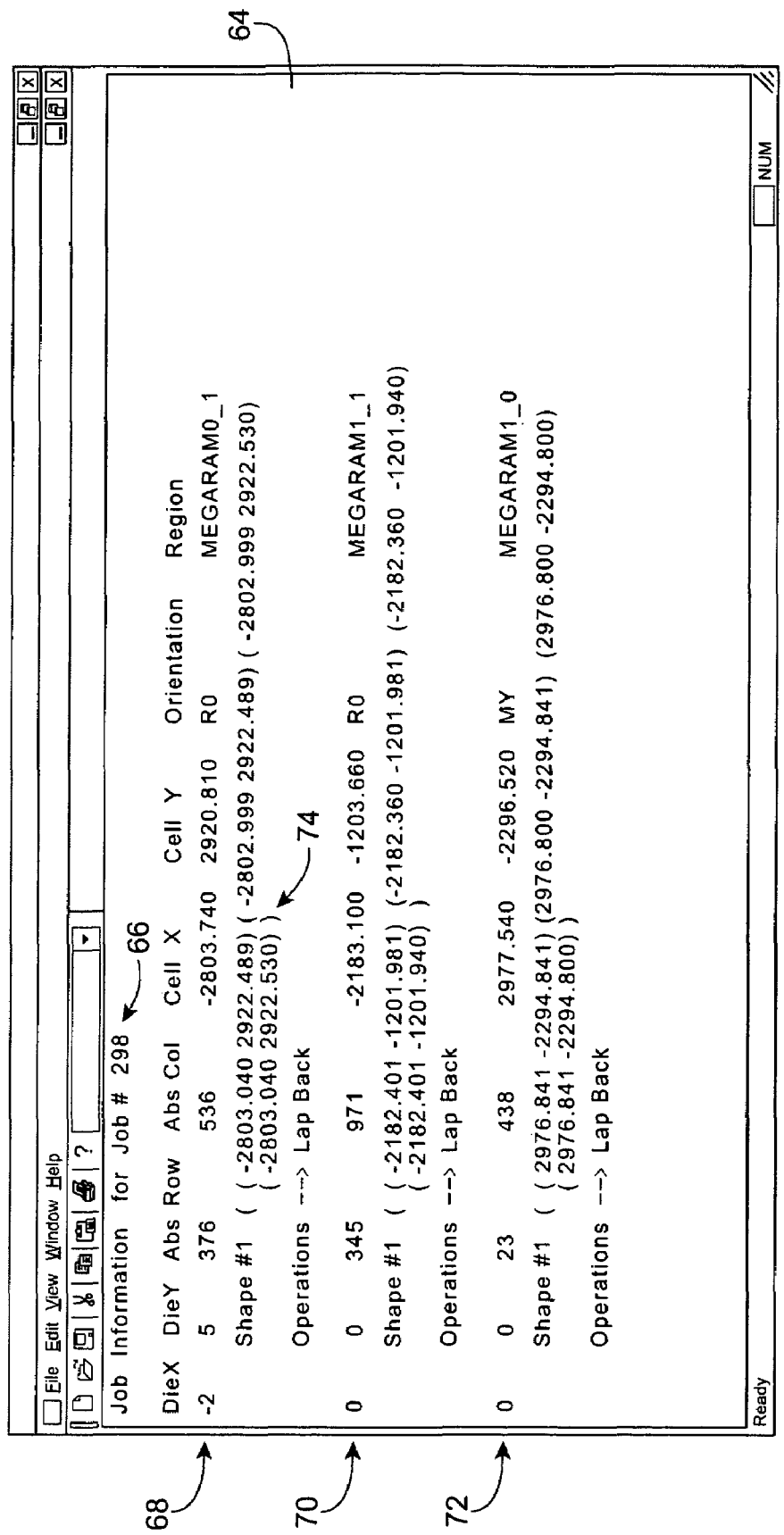
FIG. 5 shows an illustrative screen that may be presented to a user by a fault location identification and laser control program in accordance with the present invention.

After the user has selected which faults are to be marked, the user may be provided with an opportunity to review the faults to be marked. An illustrative computer screen 64 that may be presented to the user by the fault location identification and laser control program 54 is shown in FIG. 5. As shown in screen 64, the program 54 may present information to the user such as job number information 66 that identifies which job the user is working on. In the example of FIG. 5, the current job contains three faults the user has selected for marking. Each of the three faults to be marked is associated with a respective one of the rows of information 68, 70, and 72.

Each row may contain information specifying the location of the integrated circuit 12 on the wafer 10 that contains the fault for that row. For example, the fault of row 68 is located in an integrated circuit at wafer position (−2, 5) and the fault of row 70 is contained in an integrated circuit at wafer position (0, 0). Each row may also contain information on the position of the fault that is given in terms of the logical representation of the faulty circuit element. For example, in screen 64 of FIG. 5, each fault is associated with a RAM bit in a programmable logic device. The RAM cells on the device are arranged in rows and columns. The information in each row of screen 64 indicates which row and column the faulty RAM cell is located in. For example, the information in row 68 indicates that the fault of row 68 is in the RAM bit in the 376th row and 536th column of the die at (−2, 5).

The physical position of each fault may also be displayed for the user in screen 64. In row 68, for example, the faulty cell is located at x-y coordinates of (−2803.740 microns, 2920.810 microns), measured relative to the origin of the integrated circuit 12 in which the cell is contained. This position information has been derived from the test results of tester 34 without the need to manually count rows and columns on a computer display of the CAD files. Program 54 can calculate x-y position data for each fault, because program 54 has knowledge of both the fault identities (from process 48) and the CAD data necessary to map the fault identities into physical fault coordinates (from CAD files 56). Using program 54 can therefore provide highly accurate fault position information. This information is preferably used by computer-controlled laser system 36, but, if desired, the physical position information from program 54 can be displayed on a computer monitor or printed out and used by a technician (e.g., when manually inspecting and marking faults using a laser-equipped probe station).

If desired, screen 64 may contain information on the orientation of each circuit element (e.g., is it rotated with respect to a standard cell or is it mirrored with respect to a standard cell). Information may also be included on the region of circuitry in which the fault is located, if that region of circuitry has a functional name (e.g., "MEGARAM" in the example of FIG. 5). This helps the fault analysis team understand the nature of the fault.

The user can, if desired, use screen 64 to specify which type of fault analysis operation is involved (e.g., lap back, etc.). A default type of physical failure analysis may be provided, which the user can override (e.g., by typing a desired entry on top of the default or by editing the row using a drop-down "edit" option).

The program 54 may generate a default location for each fault to be laser marked. As shown in FIG. 5, for example, the program 54 has generated four x-y coordinate pairs 74 for the fault of row 68 that correspond to the bounding area of a RAM cell in which the fault is located. The x-y coordinates (−2803.740, 2920.810) correspond to the default fault location within the RAM cell. (The use of a RAM cell in this example is merely illustrative—any suitable circuit structure may be bounded by a suitable bounding box.) The default fault location may, as an example, be in the center of the bounding box.

If desired, program 54 may provide the user with an opportunity to modify the default fault location entries in screen 64. The user may, for example, be permitted to click on and type over the x-y coordinates for the default fault location, may be allowed to make changes by selecting a drop down "edit" option, may be permitted to enter a desired override x-y position using a pop-up window containing a position entry box, etc. The user may also use program 54 to specify a desired distance between each fault location and the positions at which the laser marks for that fault will be made. These techniques for specifying the fault marking location coordinates allow the user to adjust precisely which part of the RAM cell (or other structure) is to be marked for subsequent failure analysis.

After the user has reviewed the information in screen 64, the user may select a "continue" option or other suitable option (e.g., using a drop-down menu or other suitable user interface). This selection directs the program 54 to instruct computer-controlled laser system with automatic wafer alignment capabilities 36 to mark the wafer 10 accordingly.

Before laser system 36 is used to mark the faults on the wafer 10, the user loads the wafer 10 into system 36. System 36 may be any suitable computer-controlled laser system. For example, system 36 may be a commercially available system of the type that is often used to cut fuses or make repairs to integrated circuits with on-board redundant circuitry. An example of such a commercially available laser system is the ESI 9820 Laser Semiconductor Processing System available from Electro Scientific Industries, Inc. of Portland, Oreg. This is merely an illustrative example of a suitable computer-controlled laser processing system. Any suitable computer-controlled laser system may be used if desired.

System 36 preferably includes automatic wafer alignment capabilities. With automatic wafer alignment, system 36 uses computer-aided vision tools to lock onto the alignment marks 14 (FIG. 1) on each integrated circuit. Using feedback from the computer-aided vision tools, the system 36 makes adjustments to the horizontal axis (x-axis alignment), the vertical axis (y-axis alignment), and the angular orientation of the wafer (θ alignment). Once the wafer 10 has been aligned, the system 36 is ready for laser marking of the faults selected by the user.

The program 54 generates control data for controlling the system 36. The control data may be provided to the system 36 using any suitable path 58. For example, the control data may be provided by generating laser control files with the program 54 and storing those files on a locally-accessible network drive (e.g., a storage location that is connected to computer 52 through a local area network link). When initializing system 36, the stored laser control files may be loaded from the network into the system 36. System 36 may then mark each fault by directing its laser to apply a pulse of laser light at each of the laser marking locations specified in the laser control files.

In general, different systems 36 may receive control signals in different formats. An illustrative file format that may be used with laser processing systems such as the ESI 9820 is shown in FIGS. 6 and 7. With this illustrative laser control file arrangement, a first file (*.dat file of FIG. 7) is used to control the overall operation of the process.

The first five rows 76 in the file of FIG. 7 are associated with one fault and its four laser marks. The "X" entry and "Y" entry of the first two rows 76 specify the coordinates on the wafer of the integrated circuit containing the fault. The "B" entry is a bin number used by the tester for categorizing defects. The "R" entry controls the laser marks. The first item in the row labeled "R" (i.e., the number 4) specifies the number of laser marks to be made. The next four number (0, 1, 2, and 3) are indices that are associated with the entries in the table of FIG. 6. When the laser system 36 encounters the number "0" after the "4", the laser system 36 consults the "00" row of the file of FIG. 6 to determine the physical position at which to mark the wafer 10 with the laser (i.e., 8236.249, −3439.430 in this example). Similarly, when the second mark is being made, the number "1" after the "4" causes the laser system to look up the associated position in the row labeled "01" in the table of FIG. 6. This process continues until all four laser marks in the row labeled "R" in rows 76 have been made. (The trailing "0" in this row is an end-of-entry code and is not used for marking.) The entry "C=0 0" in this context serves as a placeholder. (In fuse repair applications the C or column entry is sometimes used in conjunction with the "R" or row entry.)

The entries 78 in the file of FIG. 7 are associated with two additional faults, as indicated by the number "8" in the R entry. The number 8 in the R entry of lines 78 specifies that the system 36 is to make 8 laser marks, as specified by the 8 numbers following the "8": "28", "29", etc. Upon processing each of these numbers, the laser system 36 looks to the slf.* file of FIG. 6 to determine the physical location to be used for the laser mark. For example, when processing the number 28, the laser system determines the position associated with the 28th row of the table of FIG. 6.

Figure 8:
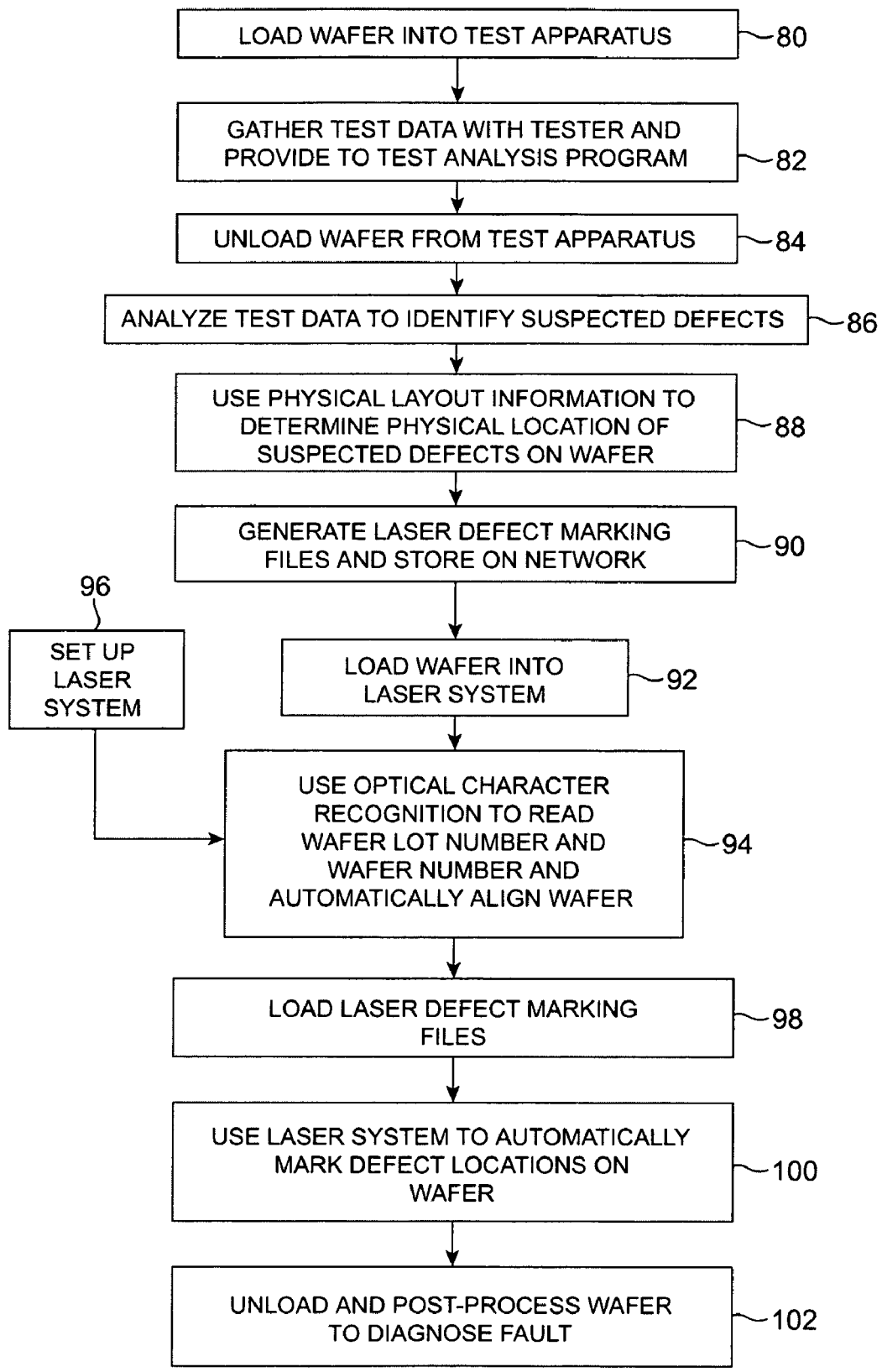
FIG. 8 is a flow chart of illustrative steps involved in using the laser system of FIG. 4 to mark faults on wafers of integrated circuits for failure analysis in accordance with the present invention.

Illustrative steps involved in using system 30 to mark defects on wafers for failure analysis are shown in FIG. 8. At step 80, a user may load a wafer 10 into tester 34 (FIG. 4). Tester 34 may have a single-wafer loading capability or may be cassette loaded. The probe card 40 is placed into electrical contact with pads or other suitable electrical contact regions in the circuitry of wafer 10 that is to be tested. Cables such as cable 42 are used to electrically connect the probe card 40 to the tester 34. If desired, other test apparatus may be used to make electrical tests of the circuitry on wafer 10. The arrangement of FIG. 4 is merely illustrative.

After the wafer has been loaded, tester 34 is used to gather test data at step 82 (FIG. 8). Although the example of FIG. 4 shows the use of a single tester 34, multiple testers may be used if desired. During testing, the tester 34 (or testers) can systematically step through some or all of the integrated circuits 12 on wafer 10 to test their circuitry. In general, multiple integrated circuits 12 are tested on wafer 10, although a single circuit could be tested if desired. As each integrated circuit 12 is tested, tester 34 records information on that circuit's position within the wafer (e.g., using a die location coordinate system such as the coordinate system shown in FIG. 1). Maintaining information on which circuit is being tested during the testing process allows faults that are identified to be located on the wafer during subsequent laser marking operations.

The type of testing that is performed by tester 34 during step 82 depends on the nature of the integrated circuit being tested (e.g., a memory chip, programmable logic device, microprocessor, digital signal processor, application-specific integrated circuit, etc.) In general, the tester 34 applies test signals (e.g., test vectors) through the electrical contacts made by probe card 40. As the circuitry of the integrated circuit 12 operates, the responses of the circuits 12 to the test signals are gathered. This test data may be analyzed to locate faults.

During step 82, the test data that is gathered by the tester (i.e., the responses of the integrated circuits 12 to the test signals applied by the tester 34) may be provided to test analysis process 48. For example, the test data from tester 34 may be provided to the test analysis process 48 by storing the test data on a network storage device to which both the tester and the test analysis process are connected or by otherwise transferring the data from the tester to the computing equipment 46. The path over which the test data is provided from the tester to the test analysis process 48 is shown schematically by path 44 of FIG. 4.

After sufficient electrical testing has been performed on the wafer 10, the wafer 10 may be unloaded from the tester 34 (step 84).

At step 86, the test data that was gathered by the tester 34 may be analyzed to detect faults in the integrated circuits 12 that are to be analyzed (e.g., using scanning electron microscopy or other suitable failure analysis techniques). Test analysis process 48 may, for example, examine the responses of the integrated circuits 12 to the test signals to identify potential faults such as transistors or interconnects that are operating too slowly, resistances or other circuit parameters that are too high or low, improper short circuits or open circuits, etc. To perform the analysis of step 86, the test analysis process 48 uses information on the design of the circuits 12 that are under test. Using this information, the analysis process can determine whether a circuit's response to the test signals is within expected tolerances. With one suitable arrangement, the test analysis process is provided with information on the circuit design for integrated circuits 12 using one or more design files 50. Design files 50 may, for example, specify the design of integrated circuits 12 using hardware description language code.

After the faults in each circuit 12 on the wafer 10 have been identified by test analysis process 48, the test analysis process 48 may provide fault identification information to fault location identification and laser control program 54. Any suitable technique may be used to pass fault identification information from test analysis process 48 to fault location identification and laser control program 54. For example, process 48 may store information identifying faults on a storage device on a network to which both computers 46 and 52 may be attached. When it is desired to obtain this information for program 54, computer 52 may be used to retrieve the stored information from the storage device.

The information identifying the faults on each integrated circuit 12 preferably includes information on the fault and its location. For example, the test analysis process may identify a fault in the RAM cell at row 45, column 499 of a particular block of RAM cells on the integrated circuit at wafer coordinates −1, 2. The nature of the fault (e.g., a short, etc.), the device that is faulty (e.g., a particular cell, transistor, interconnect line, etc.), and the wafer location of the integrated circuit containing the fault (e.g., at coordinates −1, 2) may be provided as identification of suspected faults.

At step 88, the fault location identification and laser control program 54 may map the fault identification information from test analysis process 48 into physical location data. During step 88, program 54 uses information on the physical layout of the integrated circuit. The physical layout information may be provided to fault location identification and laser control program 54 using any suitable approach. With one suitable arrangement, program 54 accesses one or more CAD files 56 for the integrated circuits 12. These CAD files contain information on the physical position of each logical structure in the integrated circuit design. For example, if a fault is located at row 5, column 35 of a given integrated circuit, the CAD files may contain information that maps this fault to a position 56 microns down and 387 microns to the right of the upper-left corner of the integrated circuit. The position information that is generated at step 88 may be displayed for a user (e.g., as shown in FIG. 5) and the user may use this information to study a particular fault. If desired, for example, the user could use the position information and a manually-controlled laser-equipped probe station to manually make four laser marks in an appropriate pattern surrounding the fault's location.

During the process of step 88, the user may be provided with an opportunity to modify a list of the faults that are to be marked. The user may also be provided with an opportunity to change the pattern of laser marks, to adjust the location of each individual mark (e.g., by typing in an override position), etc. The user may interact with the fault location identification and laser control program 54 using any suitable approach. For example, program 54 may provide the user with drop-down menu options and clickable on-screen fields with which the user may interact.

The physical location information may be encoded using any suitable format (e.g., as ASCII numbers representing absolute wafer position information in microns, as encoded numbers representing the wafer coordinates of a particular integrated circuit 12 and relative position information (e.g., the distance in microns from the origin of that particular integrated circuit where the fault is located), or using any other suitable representation.

At step 90, the fault location identification and laser control program 54 may (if desired) format the fault position data for use by computer-controlled laser system 36. If, for example, laser system 36 is a laser-driven fuse cutting apparatus that applies laser pulses based on information contained in slf.* and *.dat files of the type shown in FIGS. 6 and 7, at step 90 the fault location identification and laser control program 54 may generate these laser control files. If the laser system 36 uses a different input format, the program 54 may generate laser control files in that format. The laser control files (e.g., the slf.* and *.dat files) may be stored on a network drive for subsequent retrieval by system 36. The laser control files preferably contain information on the position of the laser marks to be made. If, for example, four surrounding laser marks are to be made for each fault, the laser control files preferably contain sufficient physical position information for system 36 to use in making each of these four marks.

The laser marking control files need not include information on the positions of the faults themselves, if the locations of the desired marks are provided. Such mark position information may be provided using an absolute coordinate system (e.g., reference to an origin on the wafer) or, preferably, in relative coordinates referenced to a point of origin on the integrated circuit on which the mark is to be made. When relative coordinates are used, the relative coordinates may be accompanied by information on the associated integrated circuit's die position (using a wafer-based coordinate system of the type shown in FIG. 1). With this type of arrangement, the ability of certain laser systems 36 to accurately locate each integrated circuit 12 on a wafer 10 using the wafer coordinates may be exploited.

Regardless of the way in which the laser marking information for the laser system 36 is supplied by program 54, this information is preferably stored on a network drive or otherwise output from program 54 at step 90 in a format that is accessible by laser system 36. (If desired, information may be transferred between components in system 30 using removable storage media such as compact discs.)

Before the laser system 36 is used to mark the faults on wafer 10, wafer 10 is loaded into system 36 at step 92 (individually, in a cassette, etc.). Once loaded into system 36 and once the laser system 36 has been set up at step 96 (e.g., to provide the system with information such as wafer size and other setup parameters), the automatic wafer alignment capabilities of system 36 may be used to align wafer 10 at step 94 (e.g., by optically recognizing and locking on to the alignment marks 14 (FIG. 1). System 36 may align wafer 10 in the horizontal dimension (x-coordinate) and vertical dimension (y-coordinate) and may perform angular alignment operations (e.g., to remove angular misalignment (θ). During automatic alignment operations, little or no user input is required, thereby saving time and increasing positioning accuracy. If desired, laser system 36 may include optical character recognition capabilities to read, for example, wafer lot number and wafer number information from the wafer.

At step 98, the program 54 may provide the laser system 36 with laser fault marking control information that specifies where system 36 is to make laser marks on the wafer that surround each fault. The laser fault marking control information may be provided using any suitable approach. For example, laser fault marking files (e.g., the slf.* and *.dat laser control files or other suitable files) may be loaded into the laser system 36 at step 98.

At step 100, laser system 36 may be used to make laser marks on the wafer at the laser marking locations specified in the laser marking files obtained from program 54. The laser system 36 may, for example, apply a laser light pulse to each of the four corners of a diamond-shaped pattern of the type shown in FIG. 3. If desired, more than four marks may be used to mark each fault or fewer than four marks may be used. Marks may be any suitable size and distance from the fault they are marking. As an example, each fault mark may be a dot about 50–1000 microns or about 200–400 microns from its associated fault.

Any suitable number of faults may be marked. Although lasers are preferably used to make the marks in system 36, other techniques (e.g., based on electrical, mechanical, or optical marking techniques) may be used if desired. An advantage of using a laser-based marking approach is that laser-based systems such as system 36 are commercially available for applications in fuse cutting, resistor trimming, circuit repair, etc. By using tools that have been developed for these applications, the sophisticated capabilities of those tools can be exploited for laser marking.

Following marking of the faults at step 100, the marked wafer 10 may be unloaded from system 36 and additional processing may be performed to complete the failure analysis process. For example, the wafer may be diced into individual die (or other suitable pieces). Each piece may then be polished along a suitable edge, while using the laser marks around the fault as a guide. Because the marks surround the fault, the fault is not damaged by the laser marking process. This allows accurate cross-sectional polishes to be made which are suitable for preparing the faults for examination under an electron microscope or other suitable diagnostic tool.

System 30 includes hardware such as tester 34 and computers 46 and 52. Tester 34 and computers 46 and 52 include processors (e.g., microprocessors) and memory (storage). The hardware of system 30 is used to run software (e.g., the control program for tester 34 and software such as process 48 and program 54). The software may be stored on a computer-readable medium (e.g., storage in tester 34 and computers 46 and 52). The storage in system 30 may include computer memory chips, removable and fixed media such as hard disk drives, flash memory, compact discs (CDs), DVDs, and floppy diskettes, tapes, or any other suitable memory or storage device(s). When the software of system 30 is installed, the storage has instructions and data that cause the computing equipment in system 30 to execute various methods (processes). When performing these processes, the computing equipment is configured to implement the functions of the system (e.g., for testing, test data analysis, fault location identification, and laser marking).

The foregoing is merely illustrative of the principles of this invention and various modifications can be made by those skilled in the art without departing from the scope and spirit of the invention.

What is claimed is:

1. A method for marking faults on a wafer containing circuitry, comprising:
    electrically testing the circuitry on the wafer using a tester to produce test data;
    analyzing the test data using a test analysis process to produce information identifying faults in the circuitry on the wafer;
    using the information identifying the faults to produce corresponding laser fault marking control information that specifies where laser marks are to be made on the wafer surrounding each fault; and
    using a computer-controlled laser system to make laser marks on the wafer in accordance with the laser fault marking control information.

2. The method defined in claim 1 further comprising:
    unloading the wafer from the tester;
    loading the unloaded wafer into the computer-controlled laser system; and
    loading the laser fault marking control information into the computer-controlled laser system before making the laser marks.

3. The method defined in claim 1 wherein the computer-controlled laser system comprises a computer-controlled laser system with automatic wafer alignment capabilities, the method further comprising loading the wafer into the laser system and automatically aligning the wafer using the laser system before making the laser marks with the laser system.

4. The method defined in claim 1 wherein analyzing the test data using the test analysis process to produce the laser fault marking control information comprises using the test analysis process to produce laser control files for the computer-controlled laser system.

5. The method defined in claim 1 wherein analyzing the test data using the test analysis process to produce the laser fault marking control information comprises using the test analysis process to produce slf.* and *.dat laser control files for the computer-controlled laser system.

6. The method defined in claim 1 wherein electrically testing the circuitry on the wafer using the tester comprises using a probe card to electrically test a plurality of integrated circuits on the wafer while gathering wafer coordinate information with the tester for each of the integrated circuits that is tested.

7. The method defined in claim 1 wherein analyzing the test data using the test analysis process further comprises using design files that contain a logical representation of the circuitry on the wafer to analyze the test data to identify the faults on the wafer.

8. The method defined in claim 1 further comprising:
    setting up the computer-controlled laser system by providing wafer size information to the computer-controlled laser system; and
    after the wafer size information has been provided to the computer-controlled laser system, loading the wafer into the computer-controlled laser system.

9. The method defined in claim 1 further comprising using optical character recognition in the computer-controlled laser system to read wafer lot number information on the wafer.

10. The method defined in claim 1 wherein using the computer-controlled laser system to make laser marks on the wafer in accordance with the laser fault marking control information comprises making four dots on the wafer surrounding each fault using the computer-controlled laser system.

11. The method defined in claim 1 further comprising using a fault location identification and laser control program running on a computer to process the information identifying the faults to produce the laser fault marking control information that specifies where laser marks are to be made on the wafer surrounding each fault.

12. The method defined in claim 1 further comprising using computer-aided design (CAD) files in processing the information identifying the faults to produce the laser fault marking control information that specifies where laser marks are to be made on the wafer surrounding each fault.

13. A system for marking faults on a wafer containing integrated circuits, comprising:
    a tester that electrically tests the integrated circuits to produce test data;
    test analysis equipment that receives the test data from the tester and that receives a logical representation of the integrated circuits and that analyses the test data using logical representation of the integrated circuits to produce information identifying the faults;
    fault location equipment that receives the information identifying the faults and that receives computer-aided design (CAD) information containing the physical layout of the integrated circuits, wherein the fault location equipment produces fault location information for each of the faults, wherein the fault location information specifies the physical position of the faults on the wafer; and
    a computer-controlled laser system that marks the faults using the fault location information.

14. The system defined in claim 13 wherein the computer-controlled laser system comprises a computer-controlled laser system with automatic wafer alignment capabilities that automatically aligns the wafer and marks the faults on the aligned wafer using the fault location information.

15. The system defined in claim 13 wherein the fault location equipment displays the fault location information for each of the faults for a user in the form of x-y coordinate data.

16. The system defined in claim 13 wherein the fault location equipment displays the fault location information for each of the faults for a user in the form of x-y coordinate data and wherein the fault location equipment allows the user to adjust the x-y coordinate data to change where laser marks will be made on the wafer.

17. The system defined in claim 13 wherein the fault location equipment displays the fault location information for each of the faults for a user in the form of integrated circuit coordinates that specify the location in wafer coordinates for each integrated circuit on the wafer and in the form of x-y coordinate data that specifies the physical position of each fault within a respective one of the integrated circuits and wherein the computer-controlled laser system that marks the faults on the wafer using the integrated circuit coordinates and using the x-y coordinate data.

18. A method of marking faults on a wafer containing a plurality of integrated circuits comprising:
  using a fault location identification program running on a computer to obtain information identifying faults on a wafer from a test analysis process and to obtain at least one computer-aided design (CAD) file containing physical layout information for the integrated circuits;
  using the fault location identification program to determine the physical position of the faults on the wafer based on the information identifying the faults and based on the physical layout information from the CAD file; and
  using a computer-controlled laser system to create laser marks on the wafer to mark the faults.

19. The method defined in claim 18 further comprising generating at least one laser control file that directs the computer-controlled laser system to create laser marks on the wafer surrounding each of the faults.

20. The method defined in claim 18 further comprising:
  generating laser control files for the computer-controlled laser system;
  loading the wafer into the computer-controlled laser system;
  automatically aligning the wafer in the computer controlled laser system; and
  using a laser in the computer-controlled laser system to mark the faults on the aligned wafer in accordance with the laser control files.

\* \* \* \* \*